(12) United States Patent
Park et al.

(10) Patent No.: US 9,406,885 B2
(45) Date of Patent: Aug. 2, 2016

(54) COATING METHOD, AND METHOD OF FORMING ORGANIC LAYER USING THE SAME

(71) Applicants: Jin-Han Park, Yongin (KR); Myeng-Woo Nam, Yongin (KR); Eui-Shin Shin, Yongin (KR); Sung-Gon Kim, Yongin (KR)

(72) Inventors: Jin-Han Park, Yongin (KR); Myeng-Woo Nam, Yongin (KR); Eui-Shin Shin, Yongin (KR); Sung-Gon Kim, Yongin (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 110 days.

(21) Appl. No.: 13/961,111

(22) Filed: Aug. 7, 2013

(65) Prior Publication Data

US 2013/0323879 A1    Dec. 5, 2013

Related U.S. Application Data

(62) Division of application No. 12/659,060, filed on Feb. 24, 2010, now abandoned.

(30) Foreign Application Priority Data

Oct. 28, 2009   (KR) .................. 10-2009-0102879

(51) Int. Cl.
| | |
|---|---|
| *B05D 5/12* | (2006.01) |
| *H01L 51/00* | (2006.01) |
| *H01L 21/67* | (2006.01) |
| *H01L 51/56* | (2006.01) |

(52) U.S. Cl.
CPC ........ *H01L 51/0026* (2013.01); *H01L 21/6715* (2013.01); *H01L 21/67115* (2013.01); *H01L 51/0008* (2013.01); *H01L 51/56* (2013.01)

(58) Field of Classification Search
USPC .......................................................... 427/66
See application file for complete search history.

(56) References Cited

U.S. PATENT DOCUMENTS

| | | | | |
|---|---|---|---|---|
| 3,655,173 | A | * | 4/1972 | Costello ............................ 432/5 |
| 6,151,794 | A | * | 11/2000 | Wu .................................... 34/68 |
| 7,101,440 | B2 | | 9/2006 | Nakamura et al. |
| 2004/0263600 | A1 | | 12/2004 | Hoshino |
| 2006/0093751 | A1 | * | 5/2006 | White ....................... B41J 3/407 |
| | | | | 427/466 |
| 2006/0099759 | A1 | * | 5/2006 | Hasei ............................ 438/222 |
| 2007/0110893 | A1 | | 5/2007 | Lennon et al. |
| 2008/0110395 | A1 | | 5/2008 | Kritchman et al. |
| 2009/0219327 | A1 | | 9/2009 | Ozawa |

FOREIGN PATENT DOCUMENTS

| | | |
|---|---|---|
| CN | 101389482 A | 3/2009 |
| CN | 101558480 A | 10/2009 |
| JP | 2005-014363 A | 1/2005 |
| KR | 10-2001-0038006 A | 5/2001 |
| KR | 10-2006-0064207 A | 6/2006 |
| KR | 10-2006-0065490 A | 6/2006 |
| KR | 10-2006-0135160 A | 12/2006 |
| KR | 10-2007-0000375 A | 1/2007 |
| KR | 10-2008-0110683 A | 12/2008 |
| KR | 10-2009-0076998 A | 7/2009 |
| KR | 10-0969332 B1 | 7/2010 |
| TW | 200417421 A | 9/2004 |
| TW | 200428899 A | 12/2004 |

\* cited by examiner

*Primary Examiner* — Austin Murata
(74) *Attorney, Agent, or Firm* — Lee & Morse, P.C.

(57) ABSTRACT

A coating apparatus includes a stage supporting a coating target, a coating part on the stage, the coating part being configured to apply a coating material onto the coating target, and a heating source opposite to and spaced apart from the stage, the heating source being configured to supply heat to the coating target after application of the coating material onto the coating target.

15 Claims, 2 Drawing Sheets

COATING METHOD, AND METHOD OF FORMING ORGANIC LAYER USING THE SAME

CROSS REFERENCE TO RELATED APPLICATION

This is a divisional application based on pending application Ser. No. 12/659,060, filed Feb. 24, 2010, the entire contents of which is hereby incorporated by reference.

BACKGROUND

1. Field

Example embodiments relate to a coating apparatus, a coating method thereof, and a method of forming an organic layer using the same that are capable of providing a layer with a substantially uniform thickness.

2. Description of the Related Art

As information communication industries have been rapidly developed, applications of display devices are also widely increased. Recently, display devices that can satisfy low power consumption, light weight, thin thickness, and high resolution are needed, e.g., flat panel display devices.

For example, a flat panel display device, e.g., a liquid crystal display (LCD) device and an organic light emitting diode (OLED) display device, may include an emission region and a thin film transistor (TFT) formed between opposite two substrates. In order to protect the emission region from external moisture, oxygen, etc., a sealing material may be applied to a periphery of the emission region to adhere the two substrates, encapsulating the emission region.

The flat panel display device may have a multi-layer structure, in which various layers, e.g., an organic layer, an inorganic layer, and a metal layer, may be deposited to form the emission region and the TFT. For example, an active matrix organic light emitting diode (AMOLED) display device may include a structure in which a buffer layer, a semiconductor layer, a gate insulating layer, a gate electrode, an interlayer insulating layer, source/drain electrodes, a protection layer, a planarization layer, a pixel defining layer, a lower electrode, an organic emission layer including an organic layer, an upper electrode, etc., are deposited. Further, the organic emission layer may include a hole injection layer and a hole transport layer between the lower electrode and the organic layer, and may further include an electron injection layer and an electron transport layer between the upper electrode and the organic layer.

The various layers in the flat panel display may be formed by applying a liquid coating material among the deposited layers, e.g., the organic layer, the interlayer insulating layer, the hole injection layer, etc. The liquid coating material may be dried to finalize a layer.

SUMMARY

Embodiments are directed to a coating apparatus, a coating method thereof, and a method of forming an organic layer using the same, which substantially overcome one or more of the problems due to the limitations and disadvantages of the related art.

It is therefore a feature of an embodiment to provide a coating apparatus forming a layer with a substantially uniform thickness.

It is therefore another feature of an embodiment to provide a coating method using a coating apparatus for forming a layer with a substantially uniform thickness.

It is yet another feature of an embodiment to provide a method of forming an organic layer using a coating apparatus capable of forming a layer with substantially uniform thickness.

At least one of the above and other features and advantages may be realized by providing a coating apparatus, including a stage on which a coating target is installed, a coating part installed on the stage and applying a coating material onto the coating target, and a heating source opposite to and spaced from the stage, and supplying heat to the coating target after applying the coating material onto the coating target.

The heating source may overlap the entire coating target, the heating source being configured to simultaneously and uniformly supply heat to the entire coating target. The heating source may be an infrared heater or a halogen lamp. The heating source may be a halogen lamp, and the heating source further comprises a reflection plate. The heating source may be vertically movable toward the stage. The heating source may be completely separated from the stage. The coating part may include a movable support frame on the stage, and an ejection part on the movable support frame, the ejection part being movable in a direction perpendicular to a movement direction of the support frame and being configured to eject the coating material. The support frame may include first support frames spaced a predetermined distance from and opposite to each other and having a predetermined height, and a second support frame having both ends disposed on the first support frames and crossing the first support frames. The second support frame may be on the first support frames and is configured to vertically move toward the stage. The ejecting part may include a movable coating head configured to move in a longitudinal direction of the second support frame, and a nozzle in the coating head and configured to eject the coating material. The coating apparatus may further include a chamber, the stage being at a lower part of the chamber, and the heating source being at an upper part in the chamber.

At least one of the above and other features and advantages may also be realized by providing a coating method, including positioning a coating target on a stage in a coating apparatus, applying the coating material onto the coating target using a coating part, and supplying heat to the coating material to dry the coating material using a heating source in the coating apparatus when the coating material is completely applied.

Supplying heat to the coating target may include supplying uniform heat simultaneously to the entire coating target. Applying a coating material may include applying an organic emission material, an organic thin layer transistor material, and/or a solar cell material. Supplying heat to the coating target may include drying the coating material at a temperature of about 100° C. to about 200° C. Supplying heat to the coating target may include using an infrared heater or a halogen lamp.

At least one of the above and other features and advantages may also be realized by providing a method of forming an organic layer, including applying an organic material onto a substrate seated on a stage in a coating apparatus using a coating part, and supplying heat to the organic material and drying the organic material to form an organic layer using a heating source in the coating apparatus after the organic material is applied.

Applying the organic material may include applying a material for forming an emission layer, a hole injection layer, a hole transport layer, an electron injection layer, and/or an electron transport layer of an organic light emitting diode. Supplying heat to the organic material may include drying the organic material at a temperature of about 100° C. to about 200° C. Supplying heat to the organic material includes supplying uniform heat simultaneously to the entire substrate to dry the organic material.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
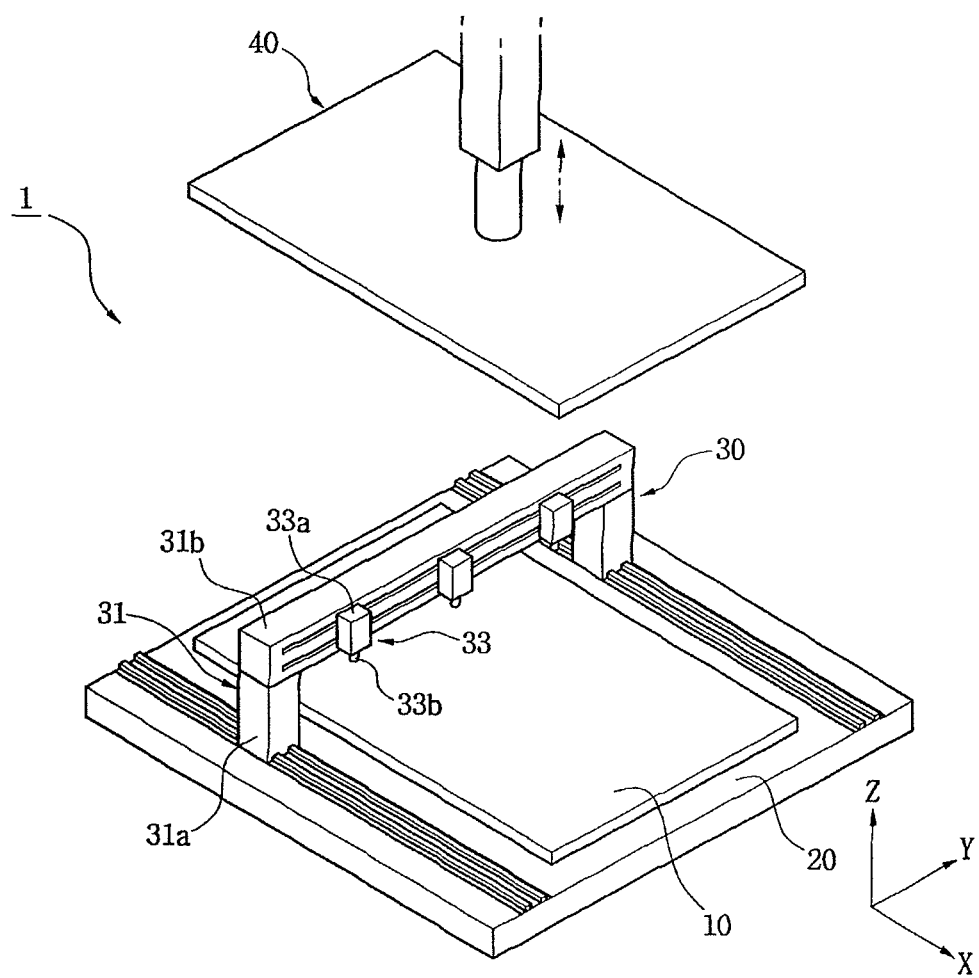
FIG. 1 illustrates a perspective view of a coating apparatus in accordance with an exemplary embodiment.

Korean Patent Application No. 10-2009-0102879, filed on Oct. 28, 2009, in the Korean Intellectual Property Office, and entitled: "Coating Apparatus, Coating Method Thereof, and Method of Forming Organic Layer Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
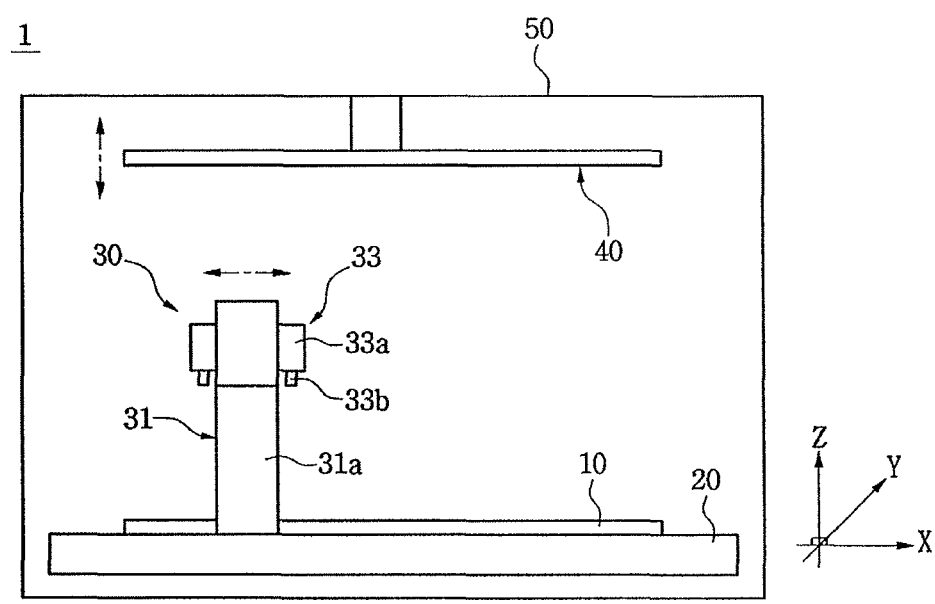
FIG. 2 illustrates a cross-sectional view of the coating apparatus of FIG. 1.

Hereinafter, example embodiments will be described in more detail with reference to FIGS. 1 and 2. FIG. 1 illustrates a perspective view of a coating apparatus in accordance with an exemplary embodiment, and FIG. 2 illustrates a cross-sectional view of the coating apparatus in FIG. 1.

Referring to FIG. 1, a coating apparatus 1 in accordance with an exemplary embodiment may include a stage 20 on which a coating target 10 is installed, a coating part 30 installed on the stage 20 and ejecting a coating material to the coating target 10, and a heating source 40 installed opposite to the stage 20.

The coating target 10 may be positioned and removed from the stage 20 by an operation of a conveyance mechanism (not shown). The coating target 10 may be, e.g., a substrate for a display device or a wafer of a semiconductor. In addition, a seating part (not shown) may be further installed on the stage 20 so that the coating target 10 may be seated. Further, a conveyance mechanism (not shown) on which the coating target 10 is seated may be disposed on the stage 20.

The coating target 10 may be positioned on the stage 20 for processing, e.g., to be coated. The coating material to be coated on the coating target 10 may be in a liquid state, e.g., a state in which a material is dissolved in a solution to be applied to the coating target 10 to form a film. For example, the coating material may be an organic material. If the coating material is an organic material used in an organic device, the coating material may not be limited to specific materials but may include organic emission materials, organic TFT materials, solar cell materials, and so on.

The coating part 30 may be movably installed on the stage 20 to apply a certain amount of the coating material onto the coating target 10. The coating part 30 may include a support frame 31 and an ejection part 33. The support frame 31 may be movably installed on the stage 20, i.e., the support frame 31 may be movable in a first direction (an X-axis direction) on the stage 20. The ejection part 33 may be installed on the support frame 31, and may be movable in a second direction (a Y-axis direction) perpendicular to the first direction (the X-axis direction) along the support frame 31 to eject the coating material onto the coating target 10. The first direction (the X-axis direction) may be a process direction, which may be a direction in which the coating part 30 moves or a direction in which the coating target 10 moves.

The support frame 31 may include first support frames 31a spaced apart and opposite to each other and having a certain height, and a second support frame 31b having both ends disposed on the first support frames 31a and crossing the first support frames 31a. The first support frames 31a may be movable on the stage 20, and the coating target 10 may be disposed on the stage 20 between the first support frames 31a. The second support frame 31b may be fixedly installed on tops of the first frames 31a. Therefore, when the first support frames 31a move on the stage 20, the second support frame 31b may be carried above the stage 20 by the first support frames 31a. For example, the second support frame 31b may be installed at a predetermined distance from the coating target 10, and may be movable toward the stage 20 in a vertical direction (Z-axis direction). In another example, the first support frames 31a and the second support frame 31b may be integrally formed with each other.

The ejection part 33 may include a plurality of coating heads 33a movably installed in a longitudinal direction (a Y-axis direction) of the second support frame 31b, and a plurality of nozzles 33b installed in the coating heads 33a, respectively, and ejecting a certain amount of coating materials. The nozzles 33b may be any suitable nozzles for coating, e.g., an inkjet head, a dispense nozzle, a die head, a knife blade, etc. The ejection part 33 may be connected to a material supply apparatus (not shown) to supply a coating material to the coating head 33a and eject the coating material through the nozzle 33b. It is noted, however, that embodiments are not limited thereto, e.g., the ejection part 33 may include a single coating head with a plurality of nozzles or a single coating head with a single nozzle.

The heating source 40 may be disposed opposite to the stage 20, and may be spaced apart from the stage 20 such that the coating part 30 may not affect a process of applying the coating material onto the coating target 10. After the coating material is applied onto the entire surface of the coating target 10 by the coating part 30, the heating source 40 may supply heat to the coating target 10 to dry the coated material and remove a solvent. It is noted that the coating material is coated and then dried on the coating target 10 without being moved.

The heat provided by the heating source 40 may be adjusted to have a predetermined temperature, such that the coating material does not move even when the coating target 10 moves. In other words, the temperature of the heating source 40 may be adjusted according to the kind of the coating material. For example, if a solvent used in the coating material for forming an organic emission layer can be removed at a temperature of about 100° C. to about 200° C., the heating source 40 may supply heat at a temperature of about 100° C. to about 200° C.

The heating source 40 may function to supply heat energy, and may include any suitable apparatus, e.g., an infrared heater, a halogen lamp, etc. For example, when the heating source 40 is an infrared heater or a halogen lamp, a heating rate of the heating source 40 may be adjusted such that the coating material may be heated in a relatively short time.

For example, when the heating source 40 is a halogen lamp, the heating source 40 may include a reflection plate disposed in a direction opposite to a direction in which light moves toward the coating target 10 to obtain optical uniformity. When the reflection plate is disposed, the heat may be effectively supplied by reflecting light emitted in a direction opposite to the coating target 10 toward the coating target 10.

One or more heating sources 40 may be disposed. In order to uniformly and simultaneously supply heat to the entire region of the coating target 10 onto which the coating material is applied, the heating source 40 may correspond to the entire region of the coating target 10. For example, as illustrated in FIG. 1, a single heating source 40 may be positioned to overlap the entire coating target 10. In another example, a plurality of heating sources may be arranged to overlap the entire coating target 10.

For example, the heating source 40 may include a flat plate having a substantially same shape as the coating target 10. At least a portion of the heating source 40, e.g., the flat plate, may be positioned substantially parallel to the coating target 10, e.g., in the xy-plane, and may overlap, e.g., completely overlap, the coating target 10. With the exception of the movable coating portion 33, the, e.g., entire, coating target 10 may be exposed to a bottom surface of the flat plate of the heating source 40, i.e., a surface facing the coating target 10, so heat from the heating source 40 may be applied substantially simultaneously and uniformly to the coating target 10. Therefore, a coating material on the coating target 10 may be dried uniformly into a substantially uniform layer.

In contrast, when heat is supplied to the coating material not uniformly, e.g., sequentially, the heat-supplied temperature may vary, thereby varying characteristics of the coated material. As such, it may be difficult to form a uniform quality of layer of the coating material. Also, when a heat source is not separated from a stage, the stage may be poorly affected by the heat, and a temperature difference between different parts, e.g., front and rear parts, of a substrate supporting the coating material may occur, so movement of the coating liquid may cause coating stains. In addition, since the conventional art cannot heat the substrate to 100° or more to increase precision of the stage, it may be difficult to heat the coating liquid not to flow.

The heating source 40 may be movably installed in a vertical direction (a z-axis direction) toward the stage 20. Therefore, interference of the heating source 40 with movement of the coating part 30 may be prevented or substantially minimized. Since the heating source 40 is movable along the vertical direction, installation of a non-movable heating source at a constant distance spaced apart from the coating target and the coating part may be eliminated, thereby avoiding an increased time required for heating the coating target at a larger distance and increasing apparatus precision.

That is, while the coating part 30 performs a coating process, the heating source 40 may be substantially spaced apart from the coating target 10. When the coating process is completed, the heating source 40 may be lowered toward the stage 20 in the Z-axis direction to supply heat to the coating target 10, thereby performing a drying process. Next, when the drying process is completed, the heating source may be raised again in the Z-axis direction to be spaced apart from the stage 20.

The stage 20 on which the coating target 10 is seated, the coating part 30 and the heating source 40 may be disposed in a chamber 50. The stage 20 may be disposed at a lower part of the chamber 50, and the heating source 40 may be disposed at an upper part of the chamber 50.

While this embodiment illustrates that the coating part 30 is a movable element with respect to the stage 20 in order to apply the coating material onto the coating target 10, other embodiments are not excluded. For example, the coating part 30 may be fixed relatively to the stage 20, while the coating target 10 may be movable to apply the coating material onto the moving coating target 10.

A coating apparatus in accordance with an exemplary embodiment may include the coating target 10 on the stage 20, the coating part 30 movable in the process direction (the X-axis direction) to apply the coating material onto the coating target 10, and the heating source 40 supplying heat to the coating material on the coating target 10, when the coating is complete, in order to dry the, e.g., liquefied, coating material. Such a heating apparatus may provide substantially uniform layer coating, e.g., substantially uniform thickness and/or characteristics.

In contrast, in a conventional method, when coating and drying of a coating material are performed in separate apparatuses, i.e., a coated coating material is transferred to and from a coating apparatus to a separate drying apparatus using a robot, a layer formed of the coating material may be deformed, e.g., have a non-uniform thickness. That is, since the coated material is conveyed into the drying apparatus in a not-yet-dried state, the temperature of the substrate, e.g., a coating target, in contact with an arm of the robot may vary and cause coating stains, the substrate may be bent due to an external force generated during the conveyance, and/or a centripetal force due to rotation of the substrate may badly affect a layer thickness on the substrate, thereby making it difficult to form a high quality layer. Therefore, forming a layer by a coating apparatus according to example embodiments may prevent variation in layer thickness, e.g., generated during conventional methods of conveying a substrate to a drying apparatus after coating the substrate with a coating material.

In other words, deformation of a layer of a coating material according to example embodiments may be prevented by performing the heating, i.e., to dry the liquefied coating material, at a same apparatus as the coating process at a temperature in which the liquefied coating material is not flowed, e.g., about 100° C. to about 200° C., so that some of the solvent can be removed. The heating temperature according to example embodiments may be lower than a temperature of a conventional separate drying apparatus, e.g., about 250° C. or higher to make a reaction between elements in the contained materials to obtain certain characteristics, thereby preventing or substantially minimizing high heat effect on the constitution of the coating material, e.g., as compared to the conventional separate coating/drying apparatuses. It is noted that the high temperature applied to the conventional drying apparatus may not be applied to the conventional coating apparatus, so the coating target in the conventional coating apparatus may be conveyed to the drying apparatus to pass through, e.g., an additional drying process.

Figure 3:
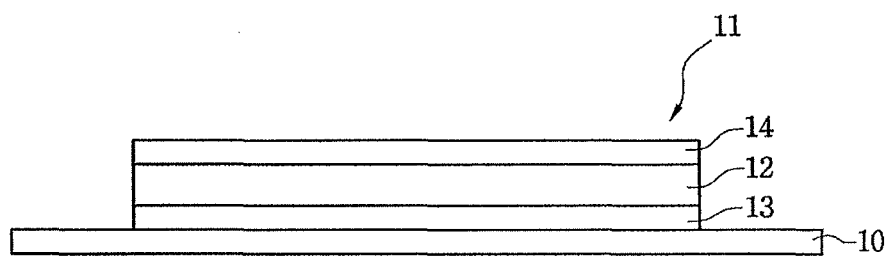
FIG. 3 illustrates a cross-sectional view of an OLED display device including an organic layer formed using the coating apparatus in accordance with an exemplary embodiment.

As illustrated in FIG. 3, in the coating apparatus 1 in accordance with the example embodiments, an organic material may be applied onto the coating target 10 to form an organic layer 12 of an OLED 11. The OLED 11 may include a first electrode layer 13, the organic layer 12, and a second electrode layer 14, which may be sequentially deposited on the coating target 10, i.e., a substrate 10.

The substrate 10 may be any suitable substrate for the OLED 11, e.g., any suitable substrate having strength sufficient to support the OLED 11. The substrate 10 may be formed of a soft material or a hard material depending on its use. For example, the substrate 10 may include one or more of glass, quartz, polypropylene, polyethylene terephthalate, polycarbonate, polymethacrylate, poly-methylmethacrylate, poly-methylacrylate, polyester, or the like.

The substrate 10 may be formed of a transparent material, when light emitted from an emission layer of the organic layer 12 passes through the substrate 10. However, the substrate 10 is not limited to a transparent material when light emitted from the emission layer of the organic layer 12 passes through a side opposite the substrate 10.

The organic layer 12 may be formed in a single layer structure including an emission layer, or in a structure having two or more layers including the emission layer. In the organic layer 12, a charge injection layer, e.g., a hole injection layer or an electron injection layer, or a charge transport layer, e.g., a hole transport layer or an electron transport layer, may be formed in addition to the emission layer.

It is noted that the emission layer of the organic layer 12 may be formed of an organic material, and may be formed by the coating apparatus 1, discussed previously with reference to FIGS. 1 and 2. However, other layers, e.g., organic layers, may be formed by the same method.

A liquefied organic material, in which a material for an emission layer is dissolved in a solvent, may be supplied to the ejection part 33 by the material supply apparatus.

For example, the organic layer 12 may include any suitable light emitting organic material, and may include, e.g., pigment emission materials, metal complex emission materials, polymer emission materials, and so on. In addition, additives, e.g., doping agent, etc., may be added for the purpose of improvement of emission efficiency and variation of emission wavelength, and the solvent may be, e.g., toluene, chloroform, dichloromethane, tetrahydrofuran, dioxane, etc.

When the substrate 10 is disposed on the stage 20, the coating part 30 may move along the process direction (the X-axis direction) to eject a certain amount of organic material supplied in the coating head 33a through the nozzle 33b, thereby applying the organic material onto the substrate 10. Next, when the organic material is applied, the heating source 40 may supply heat to the substrate 10, on which the organic material is applied, and may dry the liquefied organic material to form the organic layer 12.

Here, the temperature increased by the heating source 40 may range from about 100° C. to about 200° C. depending on the kind of solvent for the organic material. Therefore, the organic material dried in the coating apparatus 1 according to example embodiments may be sufficiently solidified, and may have a substantially uniform thickness.

As can be seen from the foregoing, since a coating material is dried in a coating apparatus, it may be possible to prevent deformation of a layer thickness, e.g., material flow caused by a conventional conveyance of a substrate from a coating apparatus to a separate drying apparatus. In addition, since a substrate is not in contact with the heating source, it may be possible to prevent thermal deformation of the substrate during the heating. Further, since there is no heating source in a stage, it may be possible to prevent deformation of the stage and there is no poor effect on precision of the apparatus.

Furthermore, since the coating material may be heated at a temperature of about 100° C. or more, it may be possible to supply sufficient heat to dry the coating material.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A coating method, comprising:
    positioning a coating target on a stage in a coating apparatus;
    applying a coating material onto the coating target using a coating part; and
    supplying heat to the coating target, after applying the coating material onto the coating target, using a heating source, the heating source being opposite to and spaced apart from the stage in the coating apparatus,
    wherein, immediately after completing application of the coating material onto the coating target, the coating material is maintained stationary until completion of the heat supplying, and
    wherein the supplying of heat to the coating target includes moving the heating source along a vertical axis, the vertical axis being parallel to a normal to the stage.

2. The coating method as claimed in claim 1, wherein the supplying of heat to the coating target includes supplying uniform heat simultaneously to the entire coating target.

3. The coating method as claimed in claim 2, wherein the supplying of uniform hear simultaneously to the entire coating target includes irradiating uniform hear simultaneously from a heat generating source toward the entire coating target, the heat generating source being the heating source spaced apart from the stage.

4. The coating method as claimed in claim 3, wherein the supplying of uniform heat simultaneously to the entire coating target includes irradiating the uniform heat from the heat generating source that completely overlaps the coating target.

5. The coating method as claimed in claim 2, wherein the supplying of heat to the coating target includes supplying uniform heat simultaneously to the entire coating target directly from the heating source, the heating source being above and spaced apart from the coating target.

6. The coating method as claimed in claim 1, wherein the applying of the coating material includes applying an organic emission material, an organic thin layer transistor material, and/or a solar cell material.

7. The coating method as claimed in claim 1, wherein the supplying of heat to the coating target includes drying the coating material at a temperature of about 100° C. to about 200° C., while maintaining the coating material at a stationary state on the stage after application thereof.

8. The coating method as claimed in claim 1, wherein the supplying of heat to the coating target includes using an infrared heater or a halogen lamp.

9. The coating method as claimed in claim 1, wherein the supplying of heat to the coating target includes supplying the heat while both the target coating and the heating source are stationary.

10. The coating method as claimed in claim 1, wherein the supplying of heat to the coating target includes moving the heating source only along the vertical axis.

11. The coating method as claimed in claim 1, wherein the coating material is continuously maintained stationary on the coating target until both the application thereof onto the coating target and the heat supply are complete.

12. A method of forming an organic layer, comprising:
applying an organic material on a substrate using a coating part, the substrate being on a stage in a coating apparatus; and
supplying heat to the organic material and drying the organic material to form an organic layer using a heating source, after the organic material is applied, the heating source being opposite to and spaced apart from the stage in the coating apparatus,
wherein, immediately after completing application of the organic material on the substrate, the organic material is maintained stationary until formation of the organic layer is complete, and
wherein the supplying of heat to the coating target includes moving the heating source along a vertical axis, the vertical axis being parallel to a normal to the stage.

13. The method as claimed in claim 12, wherein applying the organic material includes applying a material for forming an emission layer, a hole injection layer, a hole transport layer, an electron injection layer, and/or an electron transport layer of an organic light emitting diode.

14. The method as claimed in claim 12, wherein supplying heat to the organic material includes drying the organic material at a temperature of about 100° C. to about 200° C.

15. The method as claimed in claim 12, wherein supplying heat to the organic material includes supplying uniform heat simultaneously to the entire substrate to dry the organic material.

* * * * *